United States Patent [19]

Pullela et al.

[11] Patent Number: 5,903,471
[45] Date of Patent: May 11, 1999

[54] METHOD FOR OPTIMIZING ELEMENT SIZES IN A SEMICONDUCTOR DEVICE

[75] Inventors: Satyamurthy Pullela; Timothy J. Edwards; Joseph Norton; Abhijit Dharchoudhury; David Blaauw, all of Austin, Tex.

[73] Assignee: Motorola, Inc., Schaumburg, Ill.

[21] Appl. No.: 08/805,862

[22] Filed: Mar. 3, 1997

[51] Int. Cl.[6] .................................................. G06F 19/00
[52] U.S. Cl. ........................ 364/490; 364/488; 364/489; 364/490; 364/491; 364/578
[58] Field of Search .................................. 364/488, 491, 364/578

[56] References Cited

U.S. PATENT DOCUMENTS

| 4,827,428 | 5/1989 | Dunlop | 364/491 |
|---|---|---|---|
| 5,258,919 | 11/1993 | Yamanouchi | 364/489 |
| 5,426,591 | 6/1995 | Ginetti | 364/489 |
| 5,619,418 | 4/1997 | Blaauw | 364/489 |

OTHER PUBLICATIONS

US Patent Application, Satyamurthy et al., "Simulation corrected sensitivity"Serial No. 08/429,488, filed Apr. 10, 1996.

US Patent Application, Blaauw, et al., "Element Sizing for Integrated Circuits," Serial No. 08/495,061, filed Jun. 26, 1995.

US Patent Application, Blaauw et al., "A Logic Gate Size Optimization Process for an Integrated Circuit Whereby Circuit Speed is Improved While Circuit Area is Optimized," Serial No. 08/390,210, filed Feb. 16, 1995.

US Patent Application, Edwards, et al., "Power Optimization for Integrated Circuits,"Serial No. 08/521,493, filed Aug. 30, 1995.

US Patent Application, Dharchoudhury, et al., "Fast Semi-–Analytical Timing Simulation of MOS Circuits," Serial No. 08/629,489, filed on Apr. 10, 1996.

*Primary Examiner*—Kevin J. Teska
*Assistant Examiner*—Mark J. Fink
*Attorney, Agent, or Firm*—J. Gustav Larson; Daniel D. Hill

[57] ABSTRACT

A slack time, based on a required and actual delay time, is calculated for each node in a circuit (302). For each element in the circuit, a sensitivity (304) and a figure of merit (306) is calculated. A variance is determined for the calculated figure of merits (308). The circuit element having the smallest absolute figure or merit is optimized when the variance is smaller than a predefined threshold (310, 312).

13 Claims, 4 Drawing Sheets

METHOD FOR OPTIMIZING ELEMENT SIZES IN A SEMICONDUCTOR DEVICE

REFERENCE TO RELATED APPLICATIONS

The present application is related to the following U.S. patent applications:

"Method For Optimizing Element Sizes In a Semiconductor Device", invented by Satyamurthy Pullela, et al, filed concurrently with the present application and assigned to the assignee hereof;

"Method For Optimizing Circuit Performance In A Cell Based Semiconductor Device", invented by Satyamurthy Pullela, et al, filed concurrently with the present application and assigned to the assignee hereof;

"Optimizing Combinational Circuit Layout Through Iterative Restructuring", invented by Satyamurthy Pullela, et al, filed concurrently with the present application and assigned to the assignee hereof;

"Simulation corrected sensitivity", invented by Satyamurthy Pullela, et al, having Ser. No. 08/629,488, filed Apr. 10, 1996 and assigned to the assignee hereof;

"Element Sizing For Integrated Circuits", invented by David T. Blaauw et al., having Ser. No. 08/495,061, filed Jun. 26, 1995, and assigned to the assignee hereof;

"A Logic Gate Size Optimization Process For An Integrated Circuit Whereby Circuit Speed Is Improved While Circuit Area Is Optimized", invented by David T. Blaauw et al., having Ser. No. 08/390,210, filed Feb. 16, 1995, and assigned to the assignee hereof;

"Power Optimization For Integrated Circuits", invented by Timothy J. Edwards et al., having Ser. No. 08/521,493, filed Aug. 30, 1995, and assigned to the assignee hereof;

"Fast Semi-Analytical Timing Simulation Of MOS Circuits", invented by Abhijit Dharchoudhury et al., having Ser. No. 08/629,489, filed on Apr. 10, 1996, and assigned to the assignee hereof.

FIELD OF THE INVENTION

The present invention relates generally to integrated circuit design and more particularly to the design and manufacture of integrated circuits that are optimized with regard to certain design criteria.

BACKGROUND OF THE INVENTION

With the continuing and increasing demand for electronic devices of all kinds, there is a concurrent need to improve the quality and reduce the manufacturing time of these devices. In general, all electronic devices include at least one integrated circuit ("IC") or "chip" which integrates millions of transistors and connections on one tiny substrate of semiconductor material. The miniaturization of integrated circuits, and the products which they control, continues to be of major significance in the marketplace and a driving force to the manufacturers of such products.

In designing integrated circuits, there are several key criteria which need to be optimized with respect to each other in order to create a design and an on-chip layout for an integrated circuit which provides the best overall results within certain cost and other design constraints. Such criteria include the size of the chip, power consumption of the chip and the speed of operation for the various functions accomplished within the chip. This kind of optimization analysis is normally done on a workstation or other computer system running various analysis and design programs which, in turn, operate to weigh the relative significance of the various design criteria for each specific application in which the designed integrated circuit will be implemented.

One of the most important of these design criteria is the time delay involved in a particular design for a digital signal to travel through a particular path or paths on the integrated circuit to get to certain key points or nodes of the circuit in the minimum time possible consistent with performance requirements. Ideally, the best design of an integrated circuit is the design that enables a signal to traverse a predetermined layout between certain key points in the smallest amount of time, wherein the layout or integrated circuit consumes minimal power and requires the smallest amount of semiconductor area to implement. In most cases, these criteria are mutually conflicting so that one cannot be improved without decreasing the efficacy of another at least to some extent.

For example, in the "sizing" of particular transistors for a proposed integrated circuit design, it is noted that although increasing the area of the transistors in the design will, in general, decrease the time delay in signal transmission, it will also increase the size and power of the chip, and therefore limit the applicability of the chip in certain product areas, as well as reduce the profitability of the chip. Also, a decrease in the size of a chip will, in general, decrease its power consumption, heat generation and chip signal interference. The priority of each of the above design constraints and others, and the best possible solution for a particular application, will depend upon the application in which the integrated circuit is to be used. In most cases, the best result is obtained through a combination of trade-offs which is optimized with specific regard to, and consideration of, the specific application for the integrated circuit being designed.

In order to determine the level of optimization and evaluate the effectiveness of any particular design, certain analyses have been used in the industry. One such general evaluation technique is timing analysis which is intended to estimate the time delay of a signal through a digital circuit as described above. In the past, many such timing approaches have been used by circuit designers in order to optimize the efficacy or "strength" or size of a new combination of criteria values for a new integrated circuit design. One such approach adopted by some in the past is the method by which first, a timing analysis is made for a circuit, then a "critical path" is identified and only the components or elements on that critical path are analyzed for possible sizing optimization. While that approach is generally satisfactory, there is a need for an improved method for a more comprehensive approach to the sizing optimization of elements in an integrated circuit design.

In addition to the optimization of signal transition speed and silicon area for integrated circuits being designed, there is also a continuing need to optimize the design process itself which provides the optimized netlist, such that the desired circuit netlist and circuit optimizations can be accurately obtained more quickly and efficiently during the chip design process. That requirement can also be met through the implementation of the approaches and methods hereinafter disclosed.

BRIEF DESCRIPTION OF THE DRAWINGS

A better understanding of the present invention can be obtained when the following detailed description of the preferred embodiment is considered in conjunction with the following drawings, in which.

DESCRIPTION OF THE PREFERRED EMBODIMENT

Figure 1:
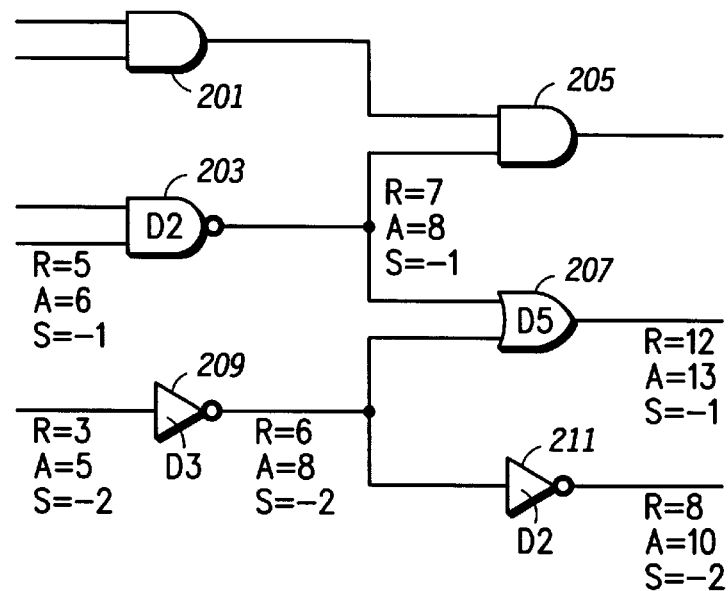
FIG. 1 is an exemplary circuit useful in explaining the slack-based method of element sizing.

The present invention determines a slack time for each node in a circuit based on a required and actual delay time. For each element in the circuit, a sensitivity and a figure of merit is calculated. A variance is determined for the calculated figure of merits. The element having the smallest absolute figure or merit is optimized when the variance is less than a predefined threshold.

The overall slack-based integrated circuit design optimization system of the present invention broadly includes using a slack time determination at circuit nodal points to change one or more characteristics of elements in the circuit design, in order to meet user needs and manufacturing constraints. The "strength" or "figure of merit" characteristic of a circuit element, for example, refers to a cumulative abstract measure of that element's beneficial or desirable characteristics. In the following example, the size of an element is the specific parameter of the strength characteristic which is changed, i.e. increased, in accordance with the slack-based method.

The slack-based optimization improves circuit performance over existing methods in that it is not limited to selecting elements from the critical path in the circuit. Instead, all elements in the circuit are examined as candidates for a size increase on every iteration of the slack-based element sizing method. This has the advantage that an element that is not on the critical path, but has a high efficacy in moving the design to the required solution, can be selected. A second advantage is that the figure of merit of an element is not based solely on its critical path impact. The critical path involves only one input node and one output node. In the slack method, the figure of merit of the element is based on its impact on the slack of all the inputs and outputs of the element. An element that has a positive effect on all its surrounding nodes can therefore be distinguished from an element that has a positive impact on one or a few of its nodes, but a negative impact on other nodes.

In the slack-based IC element sizing method disclosed herein, the required times at the outputs of the circuit are propagated through the circuit and the earliest required time at every node in the circuit is determined. The latest arrival times for signals at each node in the circuit are also determined. The difference between the latest arrival time and the earliest required time at each node is determined as the slack of the node, i.e., in the present example, the required time minus arrival time for a node in the circuit to another, equals slack.

When every node in the circuit has a slack greater than a threshold level, the circuit is generally considered to meet the user specified timing constraints, and the slack-based method is completed. The threshold level against which the slack is compared, is used in order to allow a user to compensate or account for inaccuracies in the timing analysis or to compensate for manufacturing process variations.

In the timing analysis of integrated circuits, accuracy and precision of the transitional and cumulative time delays involved in alternative switching scenarios is of utmost significance. For integrated circuits which include millions of transistors, even very small inaccuracies in propagation delay models can cause relatively large errors in circuit performance estimates, especially considering the cumulative effect of such inaccuracies. Accordingly, it is essential that circuit performance optimization tools or programs deliver efficient and accurate estimates of the propagation delay and output transition time at all output nodes of designed digital circuits and gates during the circuit design process.

One way of modeling electronic circuits and gates for design optimization involves transistor network timing simulation where transistor characteristics are approximated by various methods and an implementing computer aided design (CAD) program is thereby enhanced to iteratively arrive at a final design file or netlist which is optimized with regard to a customer specification.

In general, it is noted that the integrated circuits being designed for element sizing are comprised of a plurality of elements including transistors and logic gates. Each such transistor or gate has an inherent signal propagation delay time associated with it, and that delay is typically measured in nanoseconds or picoseconds. Timing constraints within integrated circuits are usually specified in nanoseconds and represent the maximum allowed propagation time of a signal between two different points in an integrated circuit. Such timing constraints must be met in order for the integrated circuit to meet an overall specification relative to the speed with which signal processing must occur to provide a competitive product in the market place or to be compatible with other integrated circuits in a larger system.

The speed of an integrated circuit is generally proportional to its size. For example, the strength of a transistor is related to the width of its gate. In the design of integrated circuits, an initial design is chosen and while the number of elements may remain the same, the sizes are modified for optimal size so that customer or user constraints are met but with a maximum chip size.

In a prior art method of integrated circuit element sizing, a chip design was first analyzed to identify the critical path of the circuit. The critical path of an integrated circuit includes elements which, when increased in size, will contribute directly to an improvement in overall circuit speed. In all integrated circuits there are elements that are not on a so-called critical path because an increase in the size of the off-critical-path element, although it may decrease the propagation delay of that element, will not impact the overall speed of the integrated circuit since a downstream gate will have to wait for a later generating signal in any event. The critical path refers to the path of elements which generate those later occurring signals and are therefore critical to the overall speed of the chip.

To better illustrate the overall processing of an element size determination, reference should be had to FIG. 1. In FIG. 1, an exemplary portion of an integrated circuit is shown in which signals are received by gates 201 and 203 and provide output signals which are in turn applied to additional gates 205 and 207. An inverter circuit 209 also receives an input signal and applies output signals therefrom to gate 207 and another inverter 211. Each gate in the circuit shown includes an inherent signal propagation delay time. For example, gate 209 has a delay time of 3 nanoseconds (ns), which is indicated by the "D3" notation. Similarly, gates 203 and 207 have delays of 2 ns and 5 ns, respectively, associated therewith. Also inverters 209 and 211 have delays of 3 ns and 2 ns, respectively, associated with those elements.

In the illustration, the "worst case" arrival times are calculated for all outputs of the devices in the chip. The worst case arrival time is the latest time a signal could arrive at a particular node within the circuit. In FIG. 1, as an example, the arrival times "A" is 6 ns for the lower input to AND gate 203. Similarly, inverter 209 has a signal arrival time of 5 nanoseconds, and after incurring the inherent inverter 209 delay of 3 nanoseconds, emerges at the output node of the inverter 209 with an arrival time at that point of 8 nanoseconds. The times shown are arbitrary and exemplary and are selected to show the relative arrival and delay times associated with an exemplary integrated circuit portion.

Also shown in FIG. 1, are the relative "required" or user constrained times "R", at the same nodes which must be met in order to meet overall system design requirements. AND gate 203 has a required time "R" of 5 nanoseconds for example. Similarly, inverter 209 has an input R time of 3 nanoseconds, and an output R time (after adding the device delay of 3 nanoseconds) of 6 nanoseconds. Gate 207 has an output R time of 12 ns and inverter 211 has an output R of 8 ns.

In accordance with the overall slack-based element sizing method, a slack is determined for each node. As herein before noted, slack time is defined as the "required" time less the "arrival" or actual time that a signal arrives at an appropriate node. The "required" time is the latest time a signal can arrive at a node and still allow the circuit to meet a specified user timing constraint. In implementing the method of the present invention, the worst case required times are calculated at all nodes. For each node, the required time is taken from its earliest output, and then preceding "required" times are calculated by subtracting the intrinsic delay of the preceding elements. In calculating slack, with regard to gate 203 for example, if the signal arrives at a 6 nanosecond mark which is 1 second after than the "required" R time of 5 nanoseconds, the node has a "slack" time of "−1" nanosecond. Inverter 209 has an arrival time A of 5 ns and a required time R of 3 ns, and therefore has a slack time of "−2" ns.

Figure 2:
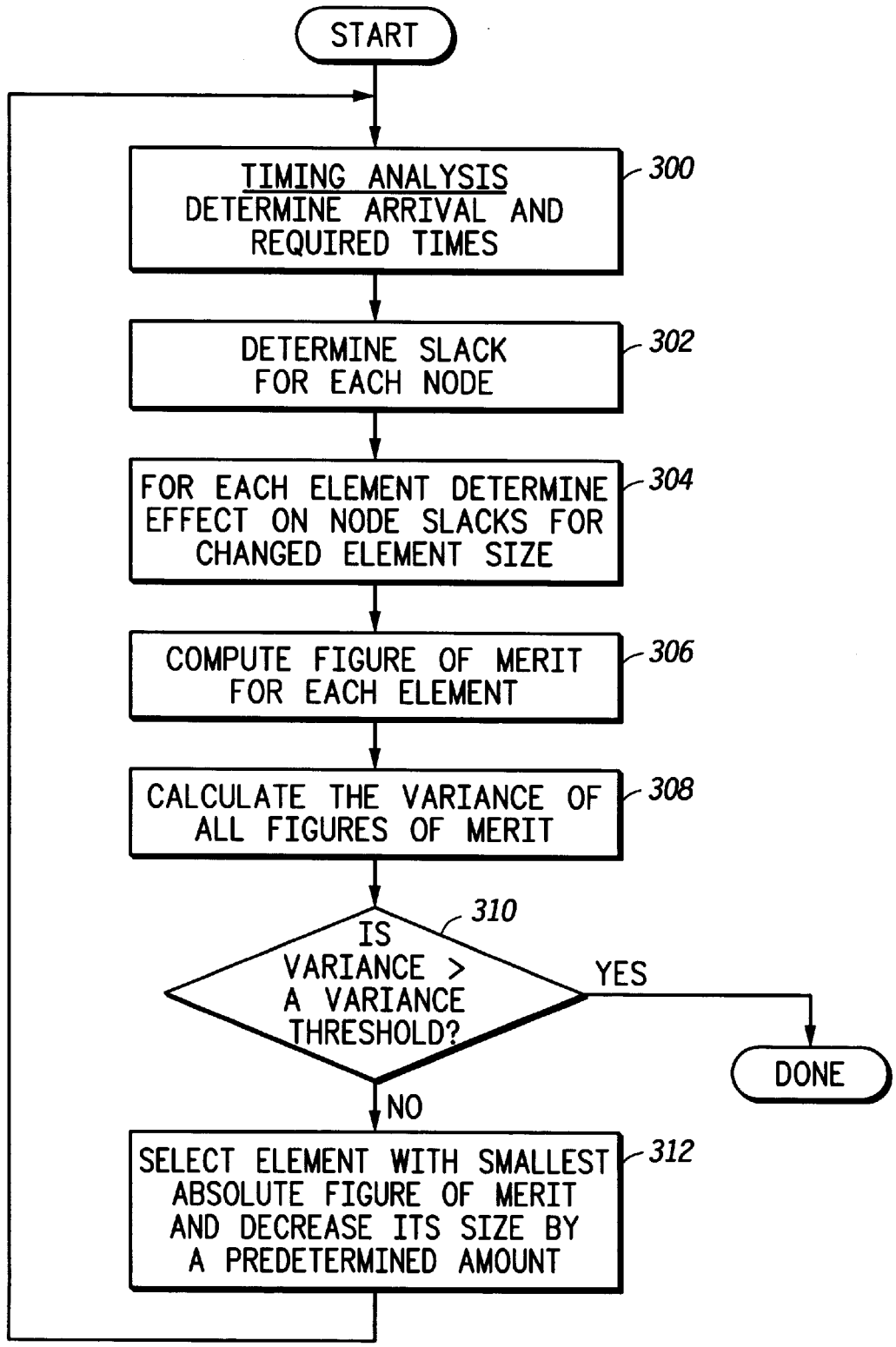
FIG. 2 is a flow diagram of the slack-based element sizing method.

As illustrated in FIG. 2, the overall slack based element sizing method includes a timing analysis function performed at step 300. The timing analysis function calculates the actual arrival and required arrival times, for a propagated signal to appear at each element node in the circuit. This step involves analyzing the timing of the circuit by calculating the actual signal arrival times at all nodes of the circuit, or circuit portion under consideration. In addition, the required signal arrival times at each of the nodes is determined or provided. The required signal arrival times are generally provided as part of a circuit specification at the output nodes of the circuit.

Next, step 302 involves the calculation or determination of the slack, i.e. the required time minus the arrival time, for each node in the circuit. Next, at step 304, the sensitivity, or effect, of each element's slack time when a certain characteristic of that element is changed is calculated. In the present example, the characteristic is the size of the element and the change is an increase in the size of the element.

At step 306, a figure of merit is calculated for each element of the circuit being optimized. A figure of merit is an indication of the impact an individual element can have on the overall optimization of a design. The figure merit for an element is based upon a sensitivity value or values of each element to the slack times of all nodes, a slack-based weighting factor for each element, and a path-based weighting factor for each element. The figure of merit represents a total weighted effect a given element has on optimizing the delay of the design. The path-based weighting factor indicates how many critical paths an element effects. The slack-based weighting factor takes into account the relative criticality of the nodes whose slacks are affected by an element. The sensitivity value represents the improvement in delay or slack that is expected along critical paths by increasing the area of an element by a specific amount. The sensitivity values for an element are weighted by the path-based weighting factor, and the slack-based weighting factor. For purposes of discussion, elements capable of having a great impact on the overall design will have a more positive figure of merit, optimally optimized devices will have a zero figure of merit, and a negative figure of merit represents elements whose further optimization will have negative impact on the over all circuit. It would be recognized by one skilled in the art that other figure of merit values could be used, such as using all positive values to represent the cases described above.

Figure 3:
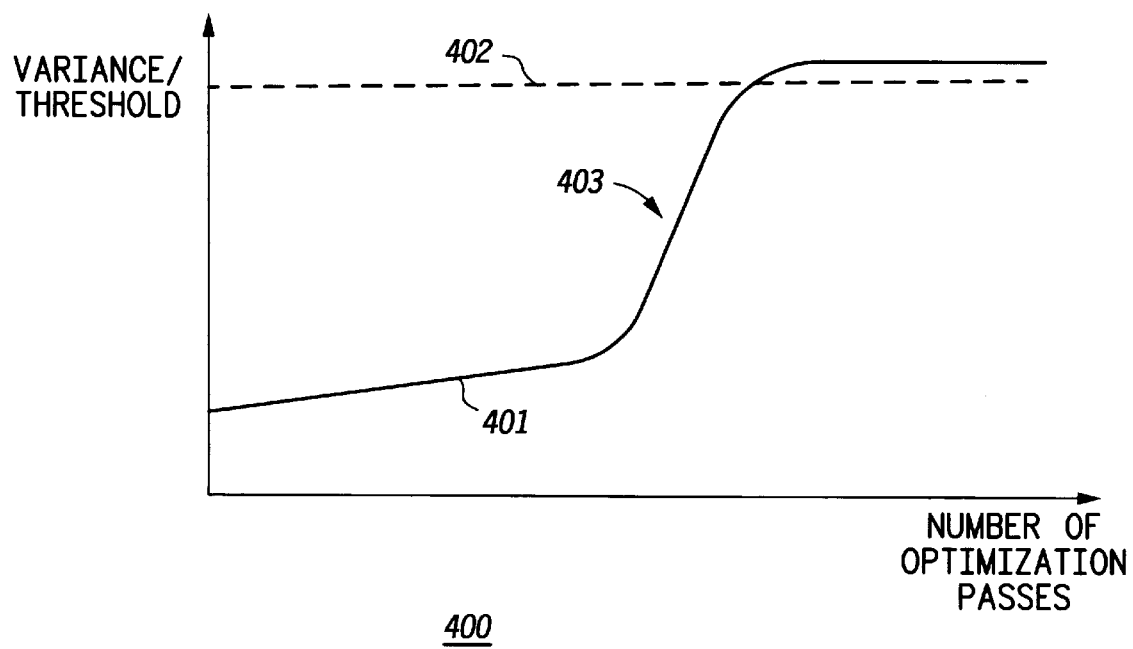
FIG. 3 is a graphical representation variance value and a threshold value for the elements of a circuit versus a number of optimization passes in accordance with the present invention.

Next, at step 308, a variance is calculated for the figures of merit of each element. Next, in step 310, a determination is made whether or not the variance is greater than a specified threshold variance. The specified threshold variance can be either automatically calculated or user defined and depends upon characteristics of the variance curve. Referring to FIG. 3, it is seen that the figure of merit variance changes based on the number of optimizing iterations. Specifically, at or near the origin of the graph of FIG. 3, the variance is shown to be at a level A. The level A represents the calculated variance for all figures of merit in the circuit. For as additional optimizing passes occur (represented by the X-axis of FIG. 3) the variance changes.

This change is generally a decrease in the overall variance of the figure of merits, indicating that a more optimal circuit has been obtained. This improvement occurs because as each individual element is optimized., its figure of merit, becomes smaller indicating less optimization is possible, until an element reaches a point where no further optimization is desirable.

Note, that the variance is equal to the sum of $(m_i-M_m)^2$) for all figure of merits i. Where ml represents the figure of merit for an element i, and $M_m$ is the mean of all elements. A characteristic of the variance curve recognized by the present invention is the steep region 403. The present invention recognizes the existence of the steep region 403. Region 403 is a point in the optimization process where a sudden drop in variance occurs from a value of approximately A to a value of approximately B. The variation drop has been experimentally observed to occur within three optimizing iterations, and generally within a single iteration. Consequently, the actual variance threshold 402, used to terminate further optimizations, can either be a threshold specified by the user indicating a desired optimization, or it can be a function of the variance curve 401 which recognizes the passing of region 403.

In a specific embodiment, a variance threshold 402 is calculated to be approximately one order of magnitude greater than the variance curve 401 value before optimization. For example, if the current value of the variance curve 401 is A, the threshold value would be approximately A divided by 10. Therefore, the variance threshold curve 402 will also vary with the curve 401. When variance is calculated following an optimization is greater than the threshold, the method of FIG. 2 is done. Where the variance is less than the variance threshold, the flow proceeds to the optimizing step 312.

At step 312, design is optimized by selecting the element with the smallest absolute figure of merit is selected and decreasing its size is by a predetermined amount. For example, the predetermined amount could be defined to be a percentage of the selected element's current size, or a fixed amount based on a minimum transistor size, such as one half of a minimum transistor size. This predetermined area is removed from the element with the absolute smallest figure of merit in order to further optimize the circuit. It should be noted, that other embodiments could select more than one element of the circuit. Generally, the element(s) chosen will have the smallest absolute merit, for example, ten percent of the total number of elements could be selected, where the 10 percent selected would generally have the smallest figures of merit may be optimized at a given time.

Following the optimizing at step 312, the flow repeats beginning at step 300, timing analysis. The flow continues until the variance is greater than the threshold variance. It should be noted that by optimizing the element with the smallest absolute figure of merit, the figures of merit for other elements in the design can change, and can change drastically, as illustrated by the region 403 of FIG. 3. The curve 401 graphically represents the effect of modifying a single or small number of elements on the variance of all figures of merit in the circuit.

Figure 4:
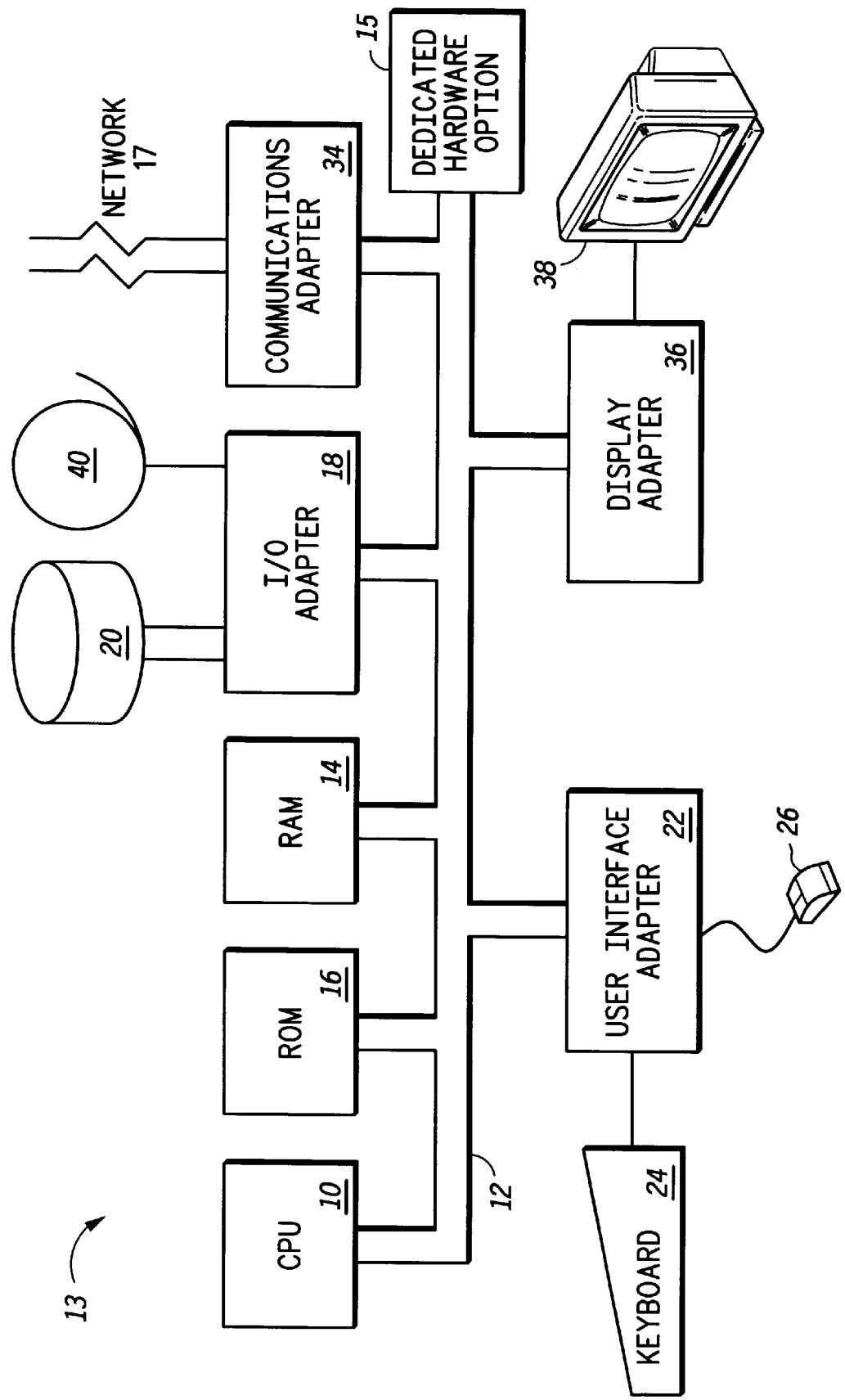
FIG. 4 is a block diagram of a system within which the various disclosed methodologies may be implemented and practiced.

As illustrated in FIG. 4, the various methods discussed above may be implemented within dedicated hardware 15, or within processes implemented within a data processing system 13. A typical hardware configuration of a workstation which may be implemented to accomplish the methodologies disclosed herein, is illustrated and includes a central processing unit (CPU) 10, such as a conventional microprocessor, and a number of other units interconnected via system bus 12. The workstation shown in FIG. 4 includes random access memory (RAM) 14, read only memory (ROM) 16, and input/output (I/O) adapter 18 for connecting peripheral devices, such as disk units 20 and tape units 40, to bus 12. A user interface adapter 22 is used to connect a keyboard device 24 and a mouse 26 to the system bus 12. Other user interface devices such as a touch screen device (not shown) may also be coupled to the system bus 12 through the user interface adapter 22.

A communication adapter 34 is also shown for connecting the workstation to a data processing network 17. Further, a display adapter 36 connects the system bus 12 to a display device 38. The method of the present invention may be implemented and stored in one or more of the disk units 20, tape drives 40, ROM 16 and/or RAM 14, or even made available to system 13 via a network connection through communications adapter 34 and thereafter processed by CPU 10. Since the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Figure 5:
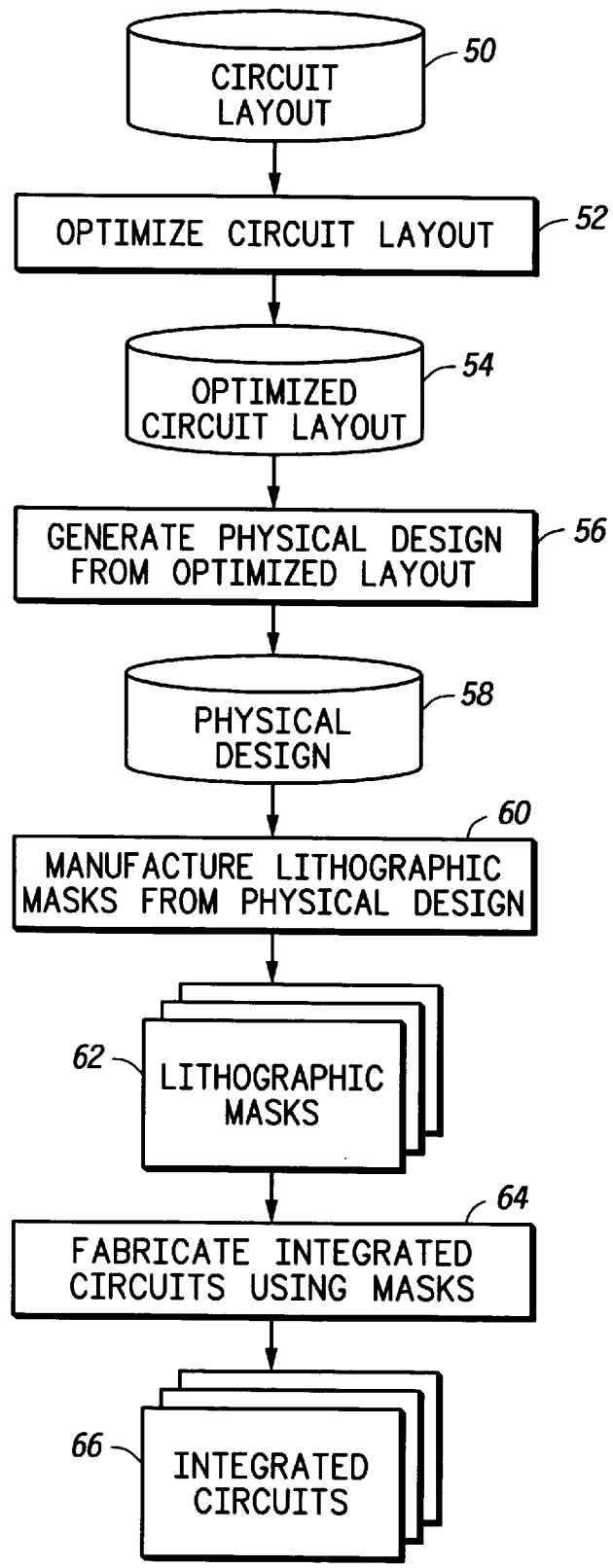
FIG. 5 is a block diagram that illustrates integrated circuit fabrication utilizing the optimized cell layout tool.

FIG. 5 is a block diagram that illustrates integrated circuit fabrication utilizing the optimized cell layout tool 52 disclosed in FIG. 4. The optimized cell layout tool 52 utilizes a circuit layout 50 to generate an optimized circuit layout 54.

A physical design file 58 is generated 56 from the optimized circuit layout 54. The circuit layout 50, optimized circuit layout 54, and physical design 58 are typically stored as data files on computer readable media such as disk units 20. The physical design file 58 includes integrated circuit dimensions, element dimensions, and element locations within the integrated circuit. The physical design file 58 locates elements and connections within a two-dimensional substrate area of an integrated circuit die. Preferably, the physical design file 58 includes physical structure for performing the functions of an integrated circuit design from which the physical design file 58 was derived. The physical design 58 is converted 60 into a set of lithographic masks 62 corresponding to the layers in the physical design file 58. The lithographic masks 62 are used to fabricate 64 integrated circuits 66.

The methods taught herein are used to generate CAD (computer aided design) data files which contain information regarding an integrated circuit and placement of gates, transistors, and the like in the integrated circuit. These files are then used to form lithographic masks which are then used to form a plurality of integrated circuits on a plurality of wafers using an integrated circuit fabrication facility. The design phase is taught in "*Principles of CMOS VLSI Design: A Systems Perspective*", by N. H. E. Weste and K. Eshragian in the VLSI Series by Addison-Wesley, 1985. Fabrication techniques are outlined in "*Silicon Processing for the VLSI Era, Volume 1: Process Technology*", by Wolf and Tauber, copyright 1986, published by Lattice Press. Process integration is taught by the second book in the series: "*Silicon Processing for the VLSI Era, Volume 2: Process Integration*", by Wolf, copyright 1990, published by Lattice Press.

The methods and implementing apparatus of the present invention has been described in connection with the preferred embodiments as disclosed herein. Although exemplary embodiments of the present invention have been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

We claim:

1. A method for sizing circuit element in a semiconductor device, comprising the steps of:

determining a required time at which a propagated input signal must arrive at predetermined nodes of a plurality of circuit elements in order to enable the plurality of circuit elements to provide an output signal at a specified output time, the required time being measured from a predetermined input start time;

determining corresponding arrival times measured from the predetermined input start time, the corresponding arrival times being representative of times which the propagated input signal actually arrives at predetermined nodes;

calculating a slack time at each of the predetermined nodes, the slack time being representative of a time difference between the corresponding arrival time and the required time;

determining an effect of the slack time at each of the predetermined nodes for circuit element sizes that changed;

calculating a figure of merit for each circuit element of the plurality of circuit elements; and adjusting the circuit element sizes for the plurality of circuit elements based on the figure of merit.

2. The method of claim 1, wherein the steps are repeated until the variance is smaller than the variance threshold.

3. The method of claim 2, further comprising the step of:

recalculating the variance threshold after adjusting the circuit element sizes, wherein the variance threshold is recalculated based on the variance of the set of figure of merits.

4. The method of claim 1, wherein the step of adjusting the circuit element sizes further comprises adjusting the circuit element sizes a predetermined amount, wherein the predetermined amount is a fraction of a current size of the circuit element.

5. The method of claim 1 further comprising the steps of:

calculating a variance of the set of figure of merits; and the step of adjusting the circuit element sizes further comprises adjusting the circuit element sizes for the plurality of circuit elements with a smallest absolute figure of merit and adjusting the circuit element sizes by a predetermined amount, when it is determined that the variance is smaller than a variance threshold.

6. The method of claim 1, further comprising the steps of:

calculating a total figure of merit for the plurality of circuit elements; and the step of adjusting the circuit element sizes further comprises adjusting the circuit element sizes for the plurality of circuit elements based on a comparison of the figure of merit for each circuit element to the total figure of merit.

7. The method of claim 6, wherein the step of adjusting includes increasing the circuit element sizes wherein the circuit element sizes are increased by a fraction of the next size increment as defined by a proportion of the figure of merit for each circuit element to the total figure of merit.

8. The method of claim 6, wherein the step of calculating a slack time further comprises determining that the slack time for each circuit element is greater than a predetermined threshold, indicating that the circuit element sizes have been optimized.

9. The method of claim 6, wherein the steps are repeated until the slack time at each of the predetermined nodes cannot be reduced further.

10. The method of claim 5, wherein the step of determining a next size increment comprises taking a fixed percentage of a total size of the semiconductor device.

11. The method of claim 5, wherein the step of determining a next size increment comprises taking a factor of a predetermined minimum size.

12. The method of claim 1 wherein the step of adjusting includes reducing circuit element sizes.

13. The method of claim 1 wherein the step of adjusting includes reducing a first circuit element size and increasing a second circuit element size.

* * * * *